US011867726B2

(12) United States Patent
Stewart et al.

(10) Patent No.: US 11,867,726 B2
(45) Date of Patent: Jan. 9, 2024

(54) METHODS FOR TRIGGERING OSCILLOSCOPES AND OSCILLOSCOPES EMPLOYING THE SAME

(71) Applicant: Micron Technology, Inc., Boise, ID (US)

(72) Inventors: Daniel B. Stewart, Boise, ID (US); Eric J. Stave, Meridian, ID (US); Matthew A. Prather, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 362 days.

(21) Appl. No.: 16/985,156

(22) Filed: Aug. 4, 2020

(65) Prior Publication Data

US 2021/0072287 A1 Mar. 11, 2021

Related U.S. Application Data

(60) Provisional application No. 62/896,793, filed on Sep. 6, 2019.

(51) Int. Cl.
*G01R 13/32* (2006.01)
(52) U.S. Cl.
CPC .................................... *G01R 13/32* (2013.01)
(58) Field of Classification Search
None
See application file for complete search history.

(56) References Cited

U.S. PATENT DOCUMENTS

| 6,374,388 | B1 * | 4/2002 | Hinch | H04L 7/042 |
| | | | | 714/799 |
| 6,629,272 | B1 * | 9/2003 | Jungerman | H04L 1/205 |
| | | | | 714/704 |
| 10,261,111 | B1 * | 4/2019 | Mattson | G01R 13/0254 |
| 2007/0282542 | A1 * | 12/2007 | Duff | G01R 13/0254 |
| | | | | 702/35 |

(Continued)

OTHER PUBLICATIONS

Xin Jiang, "Optical Performance Monitoring" Chp. 15 "Optical performance monitoring in optical long-haul transmission systems" 2010, Elsevier Doi: 10. IOI 6/B978-0-12-374950-5.00015-8 downloaded from https://www.sciencedirect.com/topics/engineering/eye-diagram on Jan. 14, 2023 (Year: 2010).*

Primary Examiner — Michael J Dalbo
Assistant Examiner — Denise R Karavias
(74) Attorney, Agent, or Firm — Perkins Coie LLP

(57) ABSTRACT

A method of operating an oscilloscope is disclosed. The method comprises providing a bit stream comprising pseudo-random data to an oscilloscope across a data path characterized by sufficient signal degradation to prevent the oscilloscope from reliably triggering a sweep of an eye pattern based on receiving the pseudo-random data; inserting a predetermined sequence of bits into the bit stream at predetermined periodic intervals to open the eye pattern sufficiently during each of the periodic intervals to permit the oscilloscope to trigger the sweep of the eye pattern; and generating the eye pattern based at least in part on the pseudo-random data and excluding the predetermined sequence of bits from the sweep of the eye pattern. Oscilloscopes configured to trigger according to a predetermined system of bits at predetermined intervals are also disclosed.

23 Claims, 8 Drawing Sheets

(56) References Cited

U.S. PATENT DOCUMENTS

| | | | |
|---|---|---|---|
| 2008/0303443 A1* | 12/2008 | Tran | G01R 13/0254 |
| | | | 315/1 |
| 2008/0307283 A1* | 12/2008 | Romero | G01R 31/318307 |
| | | | 714/742 |
| 2010/0246655 A1* | 9/2010 | Tsuchiya | G01R 31/31709 |
| | | | 375/226 |
| 2011/0002370 A1* | 1/2011 | Ikedo | G01R 13/0272 |
| | | | 375/224 |
| 2014/0079410 A1* | 3/2014 | Wang | H04B 10/564 |
| | | | 398/189 |
| 2014/0362901 A1* | 12/2014 | Tan | H04L 25/03057 |
| | | | 375/233 |
| 2015/0318919 A1* | 11/2015 | Dawe | H04L 1/20 |
| | | | 398/16 |
| 2017/0272431 A1* | 9/2017 | Villarino-Villa | H04B 3/46 |

* cited by examiner

METHODS FOR TRIGGERING OSCILLOSCOPES AND OSCILLOSCOPES EMPLOYING THE SAME

CROSS-REFERENCE TO RELATED APPLICATION(S)

This application claims the benefit of U.S. Provisional Application No. 62/896,793, filed Sep. 6, 2019; which is incorporated herein by reference in its entirety.

TECHNICAL FIELD

The present disclosure generally relates to methods for triggering oscilloscopes and oscilloscopes employing the same.

DETAILED DESCRIPTION

The quality of synchronous digital output signals of memory circuits can be monitored by observing the "eye patterns" formed by the digital signals. When the output of any digital synchronous circuit switches between ones and zeroes and these transitions are captured on an oscilloscope, each trace can be displayed over a previous trace, with the resulting superimposed traces resemble an eye.

Figure 1:
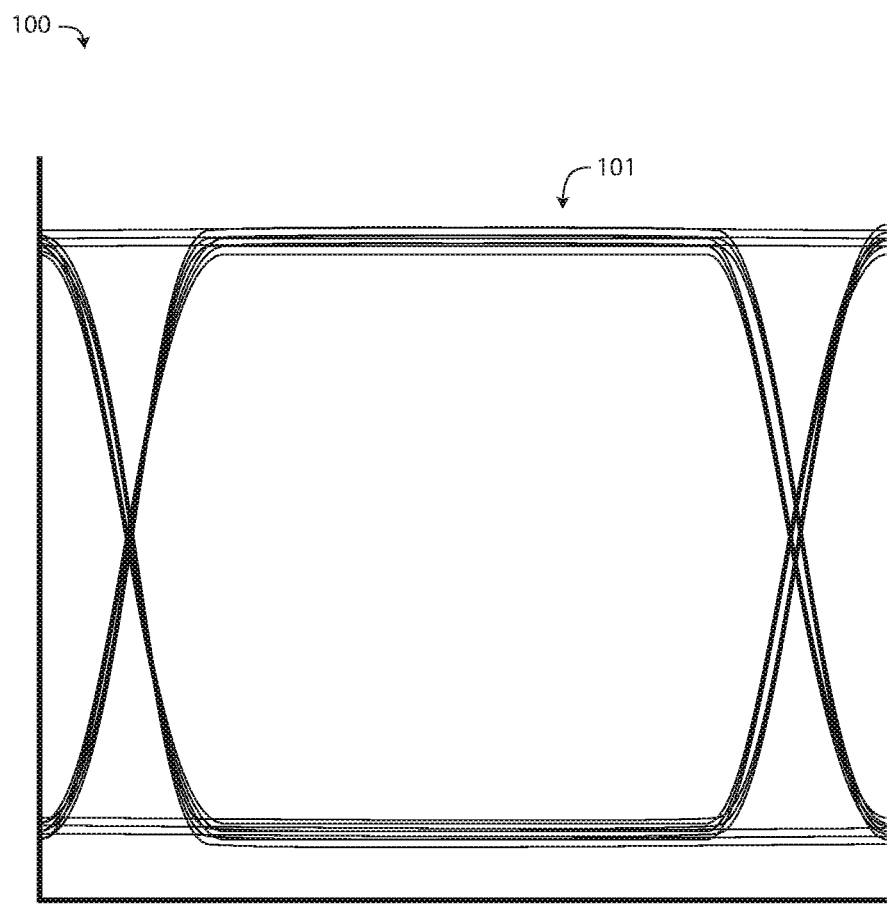
FIG. 1 is a graph illustrating the eye pattern of an oscilloscope provided an input bit stream having good signal quality.

An illustrative eye pattern is shown in FIG. 1. Diagram 100 shows an eye pattern 101 with a number of superimposed waveforms corresponding to high and low voltage rails, as well as transitions from high to low and low to high over a clock cycle. The oscilloscope can be set to observe the voltage of an input signal to the oscilloscope and to "trigger," i.e., to start capturing the waveform of the input signal on the oscilloscope based on both an input clock signal and upon the position of the signal relative to the eye pattern.

Figure 2:
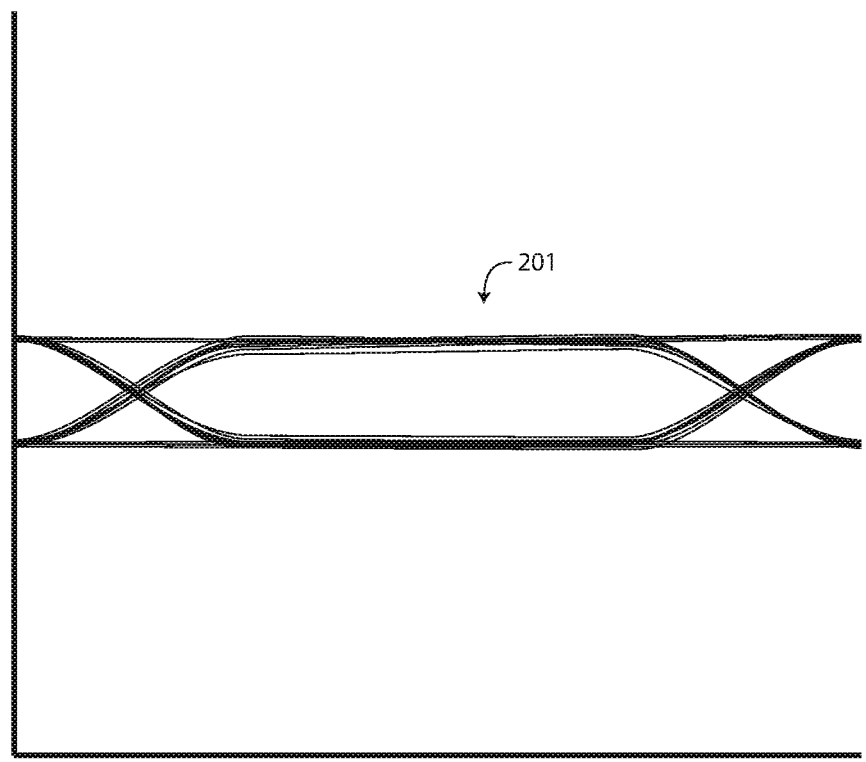
FIG. 2 is a graph illustrating the eye pattern of an oscilloscope provided an input bit stream having degraded signal quality.

As shown in FIG. 1, an eye pattern 101 is formed by the contours of the waveforms observed by the oscilloscope. The size of the perceived data eye corresponds to the quality of the input signal, with a taller data eye indicating a large voltage difference between high and low signals, and a wider data eye indicating quick transitions from the low to high voltage state and vice versa. When the quality of the input signal is lower (e.g., due to degradations caused by noise in the signal path, intersymbol interference (ISI), etc.), the data eye will be less tall and/or less wide, as can be seen with reference to FIG. 2, in which diagram 200 shows an eye pattern 201 that is both shorter and narrower than the eye pattern 101 in FIG. 1.

As the quality of the input signal continues to degrade, it can become challenging to properly trigger the oscilloscope at the appropriate time, such that accurate measurement of an eye pattern for data received across a particularly noisy channel, or with other significant degradations, may be difficult if not impossible.

To address the foregoing challenges, embodiments of the present disclosure provide methods for modifying a bit stream used to generate eye patterns in an oscilloscope to permit the oscilloscope to reliably trigger a sweep even when the signal quality of the bit stream is severely degraded. In one embodiment, a method comprises inserting a predetermined sequence of bits into a bit stream with a predetermined periodicity; providing the bit stream to an oscilloscope; and triggering the oscilloscope based on the inserted predetermined sequence of bits. The inserted predetermined sequence of bits can all have a same value (e.g., all zeros or all ones), to permit the eye pattern of the oscilloscope to open sufficiently to reliably trigger. If the oscilloscope optionally includes a decision feedback equalizer (DFE), the predetermined sequence of bits can comprise as many or more bits as the DFE has taps.

Figure 3:
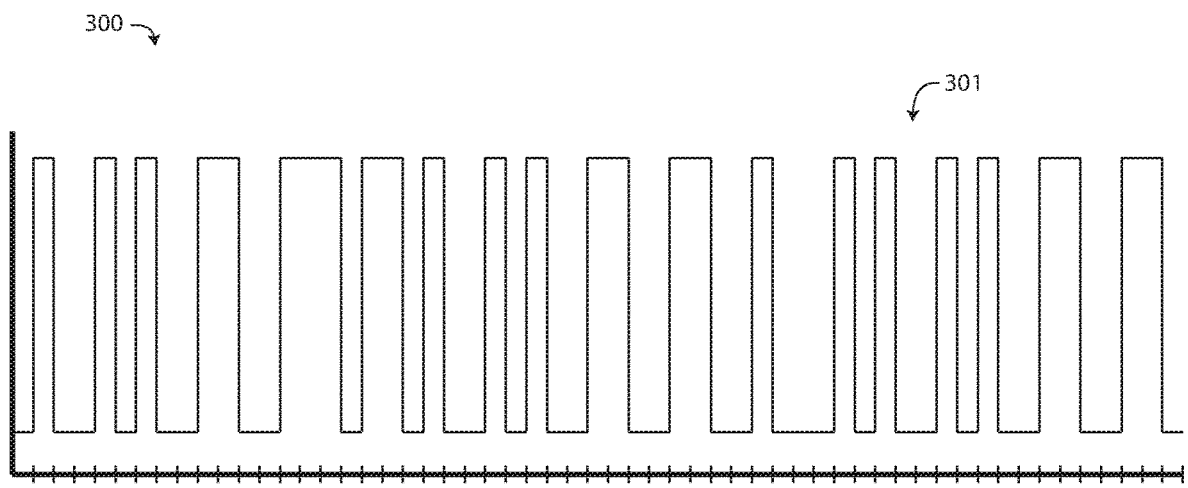
FIG. 3 is a graph illustrating a pseudo-random bit stream provided to an oscilloscope.

FIG. 3 is a graph 300 illustrating a pseudo-random bit stream (PRBS) 301 that may be provided to an oscilloscope. When the PRBS 301 is provided over a data path that degrades the signal (e.g., due to noise, intersymbol interference, etc.), the oscilloscope may have difficultly reliably triggering at the appropriate time to form an eye pattern that accurately characterizes the data path. To address this challenge, embodiments of the present disclosure can inserting a predetermined sequence of bits into a bit stream with a predetermined periodicity, as set forth in greater detail below with reference to FIG. 4.

Figure 4:
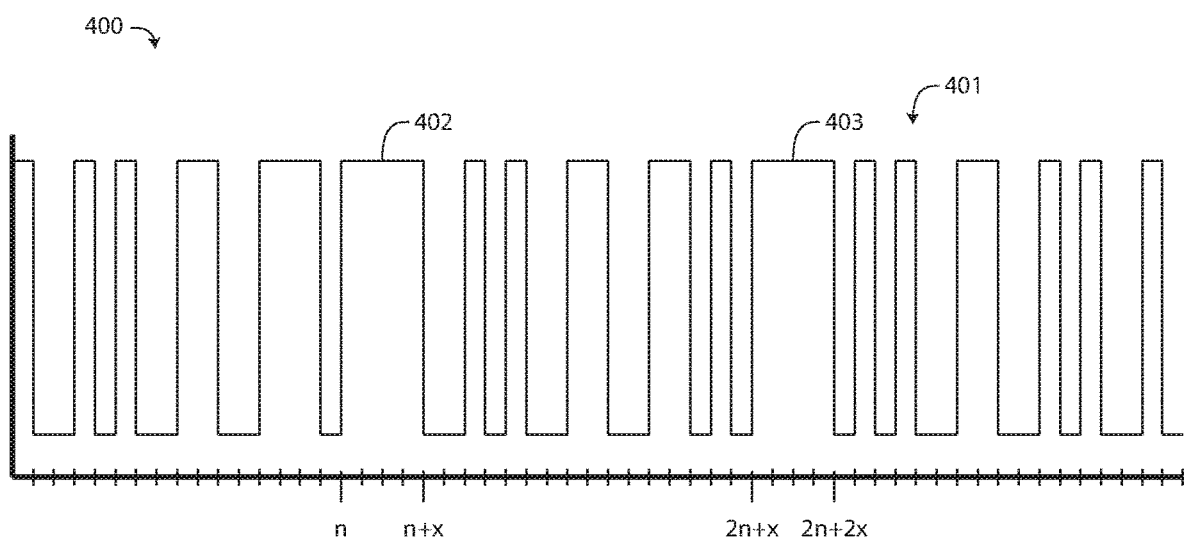
FIG. 4 is a graph illustrating another pseudo-random bit stream with a predetermined sequence of bits inserted with predetermined periodicity, in accordance with an embodiment of the present disclosure.

FIG. 4 is a graph 400 illustrating another pseudo-random bit stream 401 with a predetermined sequence of bits 402 and 403 inserted with predetermined periodicity, in accordance with an embodiment of the present disclosure. As can be seen with reference to FIG. 4, a predetermined sequence of x bits (e.g., four bits, eight bits, ten bits, 16 bits, etc.) having the same value (e.g., logical 'ones') have been inserted into bit stream 401 after every n bits (e.g., after every 16 bits, every 32 bits, every 64 bits, every 100 bits, etc.) of the bit stream (e.g., the predetermined sequence 402 of x bits having a logical value of 'one' are inserted into the bit stream at time n, after n bits of the bit stream, the predetermined sequence 403 of x bits having a logical value of 'one' are inserted into the bit stream at time 2n+x, after a further n bits of the bit stream have followed the insertion of the predetermined sequence 402). Because the predetermined sequences of bits includes bits all having the same value (e.g., either all 'ones' or all 'zeros'), the degradation of the signal across a channel will be less impacted by intersymbol interference (ISI) (e.g., due to the low frequency of a non-changing voltage value) and have a correspondingly higher signal-to-noise ratio at an oscilloscope receiving the modified signal, at least during the interval in which the predetermined sequence of bits is being transmitted (e.g., in the interval between times n and n+x, the interval between times 2n and 2n+2x, etc.). By configuring an oscilloscope to trigger during these intervals when the signal quality is highest (and the eye pattern is correspondingly larger), the ability of the oscilloscope to accurately generate an eye pattern for a degraded input signal is greatly improved.

Figure 5A:
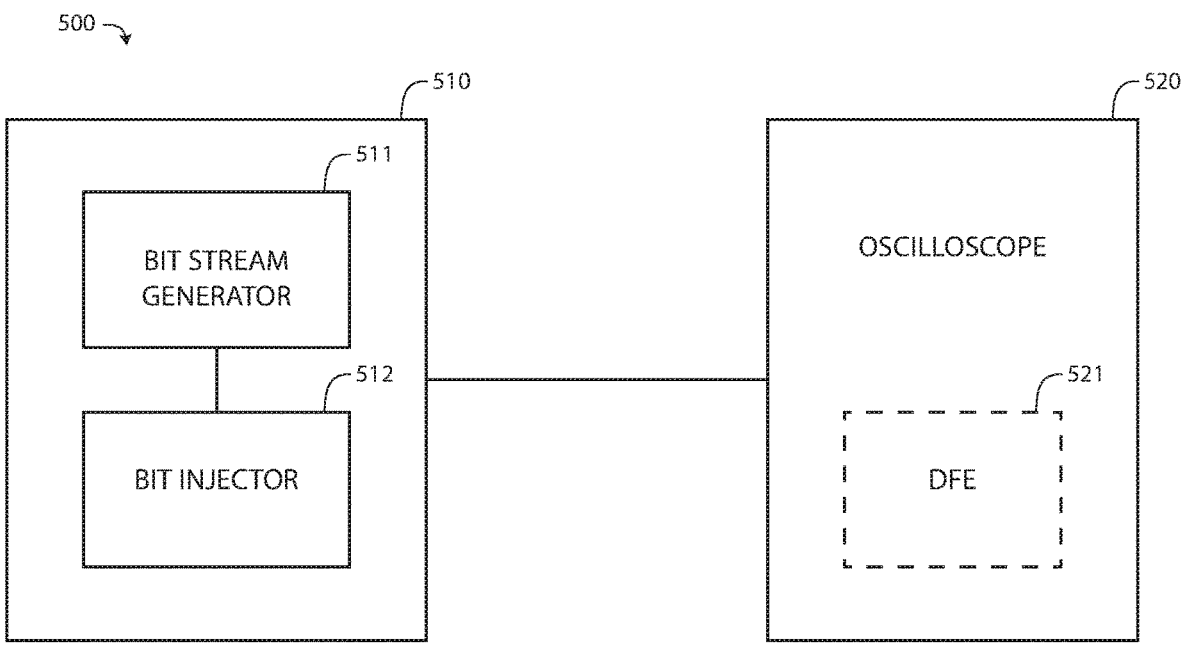
FIGS. 5A and 5B are block diagrams schematically illustrating systems for providing modified bit streams to an oscilloscope and a device under test (DUT), respectively, in accordance with various embodiments of the present disclosure.
Figure 5B:
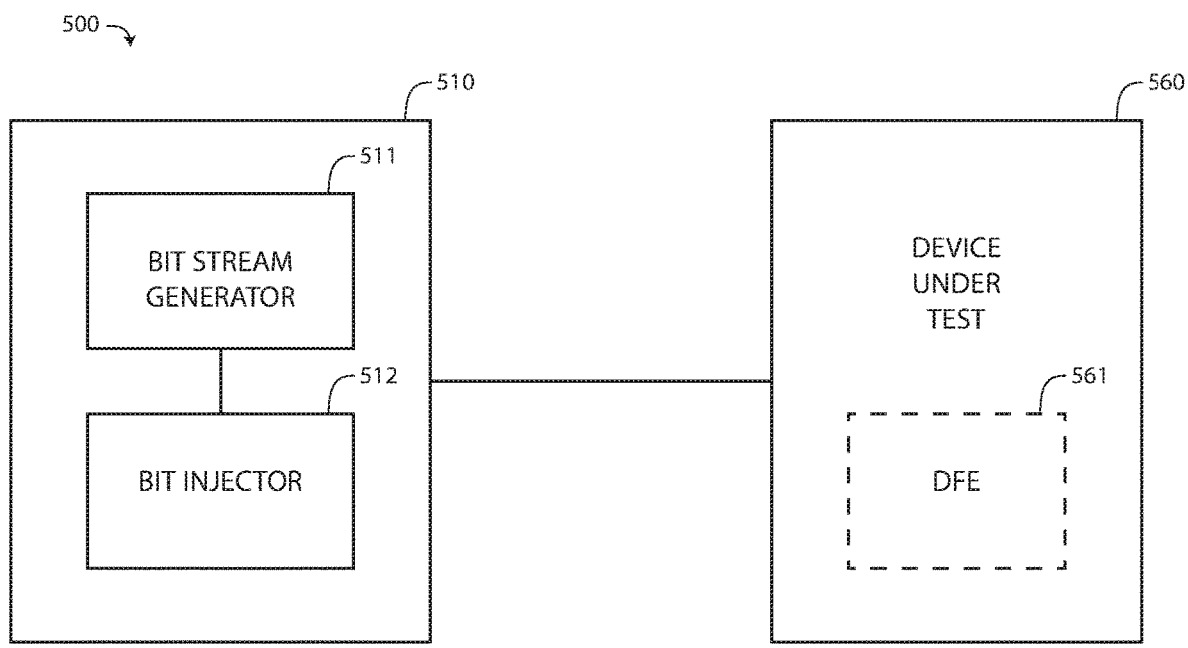

For example, FIGS. 5A and 5B are block diagrams schematically illustrating systems for providing modified bit streams to an oscilloscope and a device under test (DUT), respectively, in accordance with various embodiments of the present disclosure. As can be seen with reference to FIG. 5A, the system 500 includes an apparatus 510 including a bit stream generator 511 (e.g., a PRBS) and a bit injector 512 configured to insert a predetermined sequence of bits into the bit stream at predetermined periodic intervals, as set forth in greater detail above with reference to FIG. 4. The apparatus provides the modified bit stream (e.g., the bit stream with the inserted predetermined sequence of bits at the predetermined periodic intervals) to an oscilloscope 520. The predetermined sequence of bits is configured to "open" the eye pattern generated by the oscilloscope 520 sufficiently during each of the periodic intervals to permit the oscilloscope to trigger the sweep of the subsequent eye pattern.

In accordance with one aspect of the subject disclosure, the oscilloscope 520 can include a decision feedback equalizer (DFE) 521 for equalizing the signal received form the apparatus 510. The DFE may include one or more taps for providing feedback on previous symbol estimates when equalizing subsequent symbols. By providing a predetermined sequence of bits comprising at least as many bits (e.g., all having the same value) as there are taps, the DFE can be placed into a known state at the beginning of each sweep of the oscilloscope 520 (e.g., as the predetermined sequence of bits corresponds to the triggering of each sweep), providing improved DFE performance even on highly-degraded input signals. This improved performance of the DFE 521 can provide a reliable metric for comparing the performance of a device under test (DUT) having a similarly-configured DFE that is subsequently tested with the same bit stream.

This benefit may be better understood with reference to FIG. 5B, in which the oscilloscope 520 has been removed from system 550 and replaced with a device under test (DUT) 560. The apparatus 510 is configured to provide the same bit stream 511 provided to the DUT 560, so the performance of the DUT 560 in interpreting the signal can be compared to the virtually ideal performance of the DFE 521 of the oscilloscope 520. For example, the apparatus 510 can be a bit error rate tester (BERT) configured to test the bit error rate (BER) of DUT 560 (e.g., when DUT 560 is a memory device) by comparing the symbols of the bit stream as determined by the DFE 561 of the DUT 560 to the symbols determined by the DFE 521 of the oscilloscope 520. In this regard, apparatus 510 can be configured either to include the inserted predetermined sequence of bits in the input signal provided to the DUT 560 (so that DFE 561 can similarly be set into a known condition with regular periodicity corresponding to the periodicity of the inserted sequence), or to omit the inserted sequence to test the performance of the DUT 560 when the DFE 561 is provided with the unmodified bit stream generated by the bit stream generator 511 of the apparatus 510.

Figure 6:
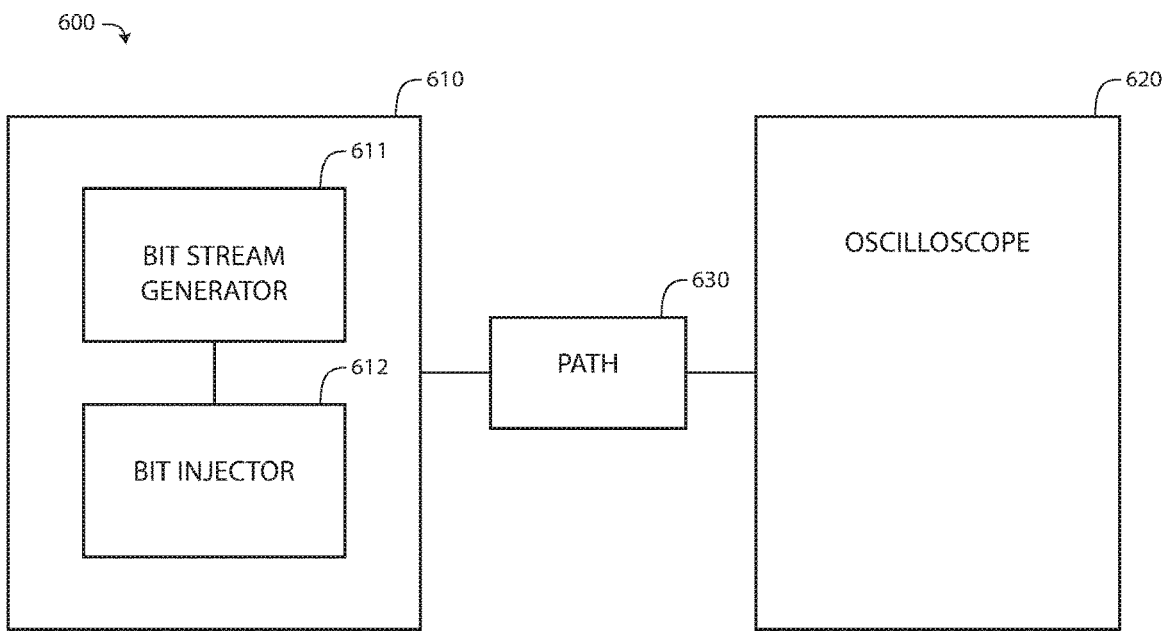
FIG. 6 is a block diagram schematically illustrating a system for providing a modified bit stream to an oscilloscope over a data path to be tested, in accordance with various embodiments of the present disclosure.

In addition to testing a device receiving an input signal, as set forth in FIGS. 5A and 5B, embodiments of the present disclosure can also be used to characterize a data path. In this regard, FIG. 6 is a block diagram schematically illustrating a system 600 for providing a modified bit stream to an oscilloscope 620 over a data path 630 to be tested, in accordance with various embodiments of the present disclosure. As can be seen with reference to FIG. 6, the system 600 includes an apparatus 610 including a bit stream generator 611 (e.g., a PRBS) and a bit injector 612 configured to insert a predetermined sequence of bits into the bit stream at predetermined periodic intervals, as set forth in greater detail above with reference to FIG. 4. The apparatus 610 provides the modified bit stream (e.g., the bit stream with the inserted predetermined sequence of bits at the predetermined periodic intervals) to an oscilloscope 620 via a data path 630 to be tested and/or characterized. The predetermined sequence of bits is configured to "open" the eye pattern generated by the oscilloscope 620 sufficiently during each of the periodic intervals to permit the oscilloscope to trigger the sweep of the subsequent eye pattern, such that the eye pattern corresponding to the data path 630 can be generated reliably even when data path 630 greatly degrades the signal, beyond what a conventional oscilloscope could be reliably expected to characterize (e.g., due to the unreliability of the trigger on a partially-closed, mostly-closed, or even completely-closed eye pattern).

For example, in one embodiment of the present disclosure apparatus 610 can comprise a CPU operably connected to a motherboard, and oscilloscope 620 can be operably connected to a memory connector (e.g., DIMM slot) of the same motherboard. By configuring the CPU of apparatus 610 to generate a bit stream and insert the predetermined sequence of bits configured to open a data eye for reliable oscilloscope triggering, the data path 630 of the memory bus of the motherboard can be reliably characterized with an eye pattern. Alternatively, in another embodiment of the present disclosure apparatus 610 can comprise a BERT configured to provide the input signal to a memory connector of a motherboard and oscilloscope 620 can be operably connected to a CPU slot of the motherboard, so that an eye pattern characterizing the memory bus of the motherboard in the other direction (e.g., from the memory slot to the CPU slot, rather than vice versa) can also be reliably generated. In yet another embodiment, similar arrangements can be used to test a memory bus of a graphics card (e.g., from the GPU of a graphics card to a memory slot thereof, or from the memory slot thereof back to the GPU slot, mutatis mutandis).

According to one aspect of the subject disclosure, an oscilloscope (e.g., such as oscilloscope 520 or oscilloscope 620) can be further configured to generate an eye pattern that omits information corresponding to the predetermined sequence of bits, to more accurately characterize the device or data path under test (e.g., based upon only the PRBS and not the predetermined sequence of bits). In this regard, when the bit stream includes a predetermined sequence of bits (e.g., of a known number of x bits, where x is a positive integer) with a predetermined periodicity (e.g., after every n bits of data in the PRBS), the oscilloscope can be configured to trigger a sweep based on detecting the predetermined sequence during the predetermined interval, but not to include the voltages corresponding to the predetermined sequence in the eye pattern. In this regard, when the oscilloscope includes a DFE (e.g., such as oscilloscope 520 with DFE 521), the oscilloscope can be further configured to similarly exclude bits immediately subsequent to the predetermined sequence of bits from the eye pattern, to more accurately characterize the performance of the DFE of a device under test subsequently tested by excluding bits that are determined by the DFE when placed into a known state (e.g., as this may not be the state to which the DFE in the DUT corresponds). The number of bits subsequent to the predetermined sequence that are omitted may be the same as the number of bits in the predetermined sequence (e.g., when the number of bits in the sequence corresponds to a number of taps of the DFE), or it may be greater or less as is determined when optimizing the test protocol.

Figure 7:
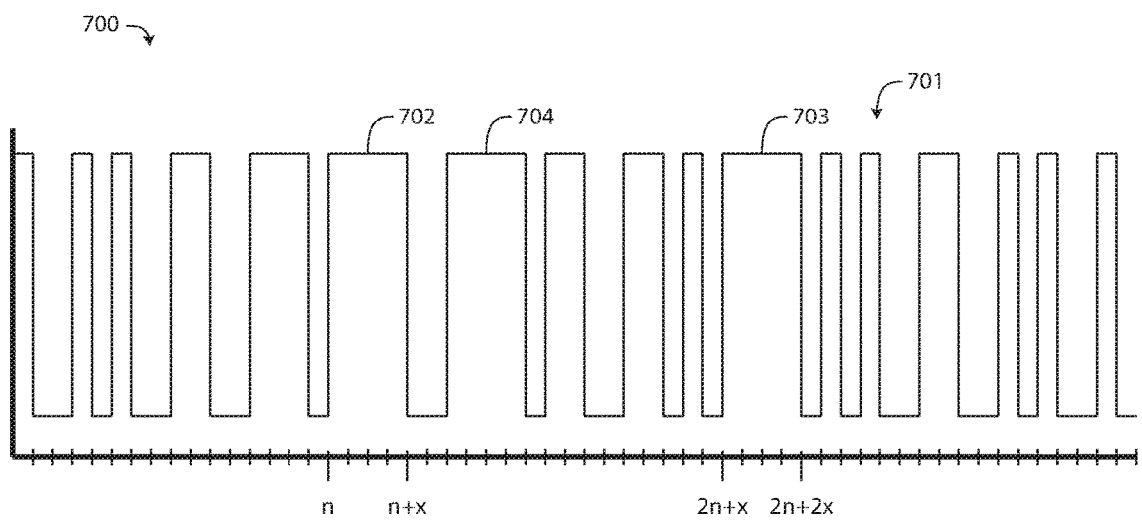
FIG. 7 is a graph illustrating yet another pseudo-random bit stream with a predetermined sequence of bits inserted with predetermined periodicity, in accordance with an embodiment of the present disclosure.

As set forth above, an oscilloscope can be configured to trigger based on detecting a predetermined sequence of bits inserted into a bit stream with known periodicity. It remains possible, with a likelihood depending upon the number of bits in the sequence, that the bit stream itself may include the same sequence of bits occurring at times other than the interval corresponding to the predetermined periodicity. For example, FIG. 7 is a graph illustrating another pseudo-random bit stream 701 with a predetermined sequence of bits 702 and 703 inserted with predetermined periodicity, in accordance with an embodiment of the present disclosure. As can be seen with reference to FIG. 7, a sequence 704 of bits (e.g., logical 'ones') that corresponds to the predetermined sequences 702 and 703 occurs in the bit stream 701 outside of the periodic intervals (e.g., outside of the interval between times n and n+x, the interval between times 2n and 2n+2x, etc.). By configuring an oscilloscope to only trigger during the intervals that correspond to the predetermined periodicity of the inserted predetermined sequence of bits, "false positive" trigger events, such as the sequence 704 of bits in bit stream 701, can be avoided, and the reliability of the trigger timing of the oscilloscope can be improved.

Although in the foregoing example embodiments bit streams have been described and illustrated as pseudo-random, in other embodiments of the present disclosure other bit streams (e.g., data bit streams, other non-randomized bit streams) may also benefit from the insertion of predetermined bit sequences to improve oscilloscope triggering. Moreover, although predetermined sequences with four logic-high bits (i.e., 'ones') have been illustrated and described, in other embodiments of the present disclosure other predetermined sequences with different numbers of bits (e.g., any positive integer number of bits) with the same values (e.g., all 'ones,' all 'zeros') or other patterns (e.g., alternating 'ones' and 'zeros,' etc.) may also be used.

Moreover, although in the foregoing example embodiments oscilloscopes with decision feedback equalizers have been illustrated and described, in other embodiments other equalizers (e.g., feed-forward equalizers, linear equalizers, etc.) or no equalizers may also be used. Further, although data paths between memory slots and processors (e.g., CPUs, GPUs) have been described and illustrated in connection with methodologies of testing and characterizing data paths, other data paths between any two circuit devices, including non-memory devices (e.g., between expansion card slots and southbridge controllers, between graphics card slots and northbridge controllers, between application specific integrated circuit (ASIC) devices and any other device) in any system, whether a computing system or otherwise, can also benefit from the foregoing testing and characterization methodologies.

Figure 8:
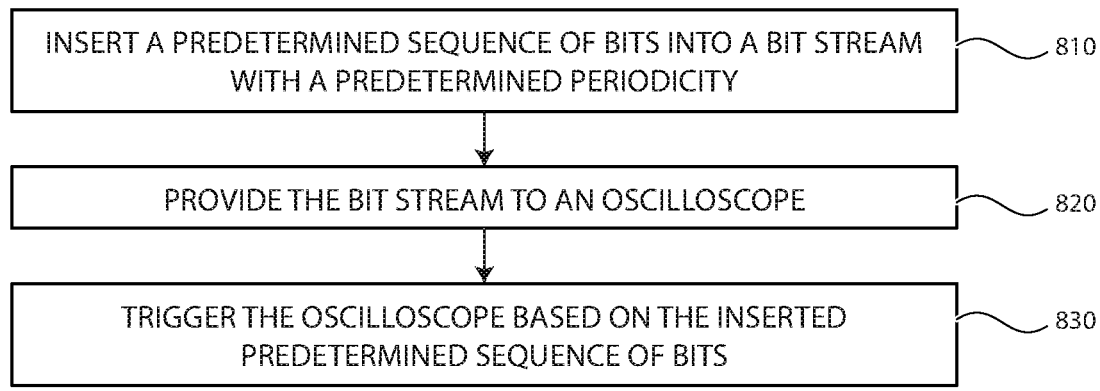
FIGS. 8 and 9 are flow charts illustrating methods according to various embodiments of the present disclosure.
Figure 9:
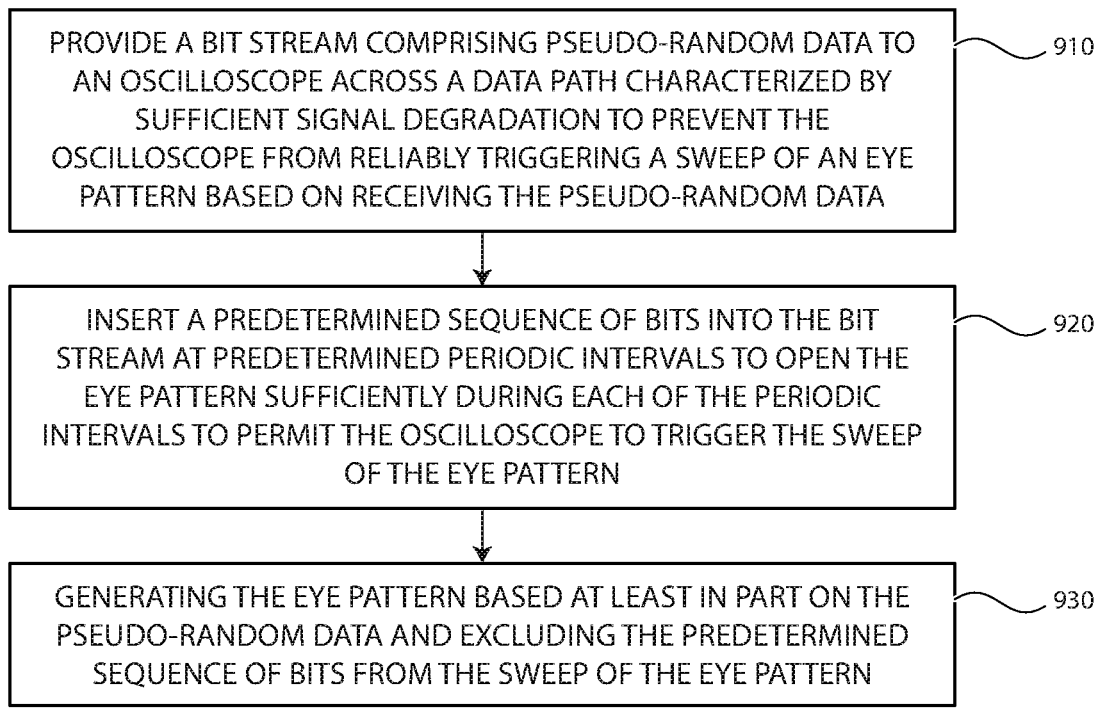

Turning to FIGS. 8 and 9, flow charts illustrating methods according to various embodiments of the present disclosure are provided to assist in the understanding of different aspects thereof. In this regard, FIG. 8 is a flow chart illustrating a method of operating an oscilloscope in accordance with an embodiment of the present technology. The method includes inserting a predetermined sequence of bits into a bit stream with a predetermined periodicity (box 810). According to one aspect of the present disclosure, the inserting features of box 810 may be implemented with a bit injector 512, as illustrated in FIG. 5A in greater detail, above. The method further includes providing the bit stream to an oscilloscope (box 820). According to one aspect of the present disclosure, the providing features of box 820 may be implemented with a data path 630, as illustrated in FIG. 6 in greater detail, above. The method further includes triggering the oscilloscope based on the inserted predetermined sequence of bits (box 830). According to one aspect of the present disclosure, the triggering features of box 830 may be implemented with an oscilloscope 520, as illustrated in FIG. 5A in greater detail, above.

FIG. 9 is a flow chart illustrating a method of operating an oscilloscope in accordance with an embodiment of the present technology. The method includes providing a bit stream comprising pseudo-random data to an oscilloscope across a data path characterized by sufficient signal degradation to prevent the oscilloscope from reliably triggering a sweep of an eye pattern based on receiving the pseudo-random data (box 910). According to one aspect of the present disclosure, the providing features of box 810 may be implemented with an apparatus 510 and a bit stream generator 511, as illustrated in FIG. 5A in greater detail, above. The method further includes inserting a predetermined sequence of bits into the bit stream at predetermined periodic intervals to open the eye pattern sufficiently during each of the periodic intervals to permit the oscilloscope to trigger the sweep of the eye pattern (box 920). According to one aspect of the present disclosure, the inserting features of box 910 may be implemented with a bit injector 512, as illustrated in FIG. 5A in greater detail, above. The method further includes generating the eye pattern based at least in part on the pseudo-random data and excluding the predetermined sequence of bits from the sweep of the eye pattern (box 930). According to one aspect of the present disclosure, the generating features of box 930 may be implemented with an oscilloscope 520, as illustrated in FIG. 5A in greater detail, above.

Figure 10:
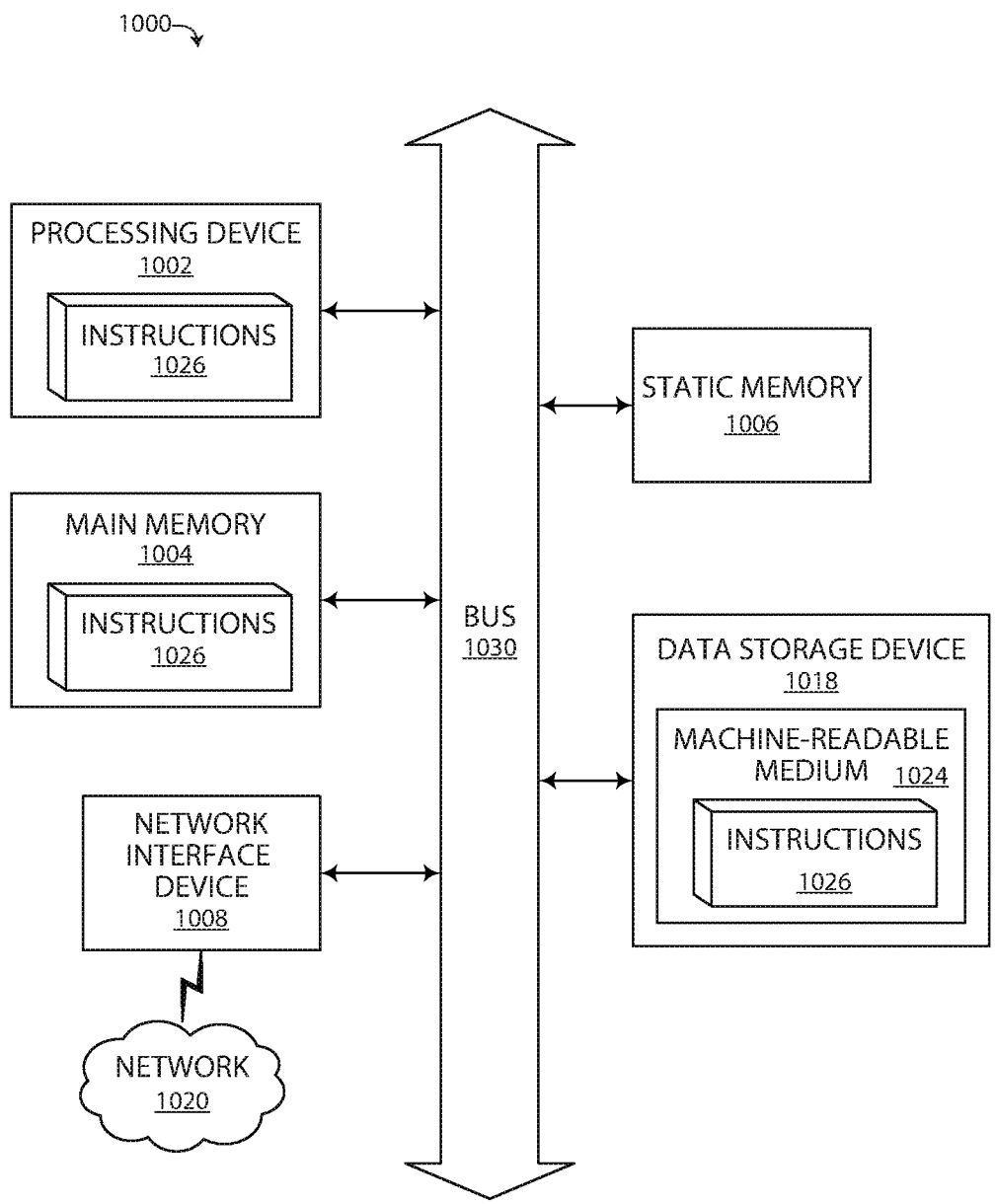
FIG. 10 is a block diagram schematically illustrating a computer system in accordance with an embodiment of the present disclosure.

FIG. 10 is a block diagram schematically illustrating a computer system in accordance with an embodiment of the present disclosure. As can be seen with reference to FIG. 10, an example machine of a computer system 1000 can include a set of instructions, which can cause the machine to perform any one or more of the methodologies discussed herein when executed. In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 1000 includes a processing device 1002, a main memory 1004 (e.g., read-only memory (ROM), flash memory, dynamic random access memory (DRAM) such as synchronous DRAM (SDRAM) or Rambus DRAM (RDRAM), etc.), a static memory 1006 (e.g., flash memory, static random access memory (SRAM), etc.), and a data storage system 1018, which communicate with each other via a bus 1030. Processing device 1002 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 1002 can also be one or more special-purpose processing devices such as an application specific integrated circuit (ASIC), a field programmable gate array (FPGA), a digital signal processor (DSP), network processor, or the like. The processing device 1002 is configured to execute instructions 1026 for performing the operations and steps discussed herein. The computer system 1000 can further include a network interface device 1008 to communicate over the network 1020.

The data storage system 1018 can include a non-transitory machine-readable storage medium 1024 (also known as a computer-readable medium) on which is stored one or more sets of instructions 1026 or software embodying any one or more of the methodologies or functions described herein. The instructions 1026 can also reside, completely or at least partially, within the main memory 1004 and/or within the processing device 1002 during execution thereof by the computer system 1000, the main memory 1004 and the processing device 1002 also constituting machine-readable storage media.

While the non-transitory machine-readable storage medium 1024 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

Those skilled in the art will appreciate that the components and blocks illustrated in FIGS. 1-10 described above, may be altered in a variety of ways. For example, the order of the logic may be rearranged, substeps may be performed in parallel, illustrated logic may be omitted, other logic may be included, etc. In some implementations, one or more of the components described above can execute one or more of the processes described below.

It should be noted that the methods described above describe possible implementations, and that the operations and the steps may be rearranged or otherwise modified and that other implementations are possible. Furthermore, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

Reference in this specification to "implementations" (e.g. "some implementations," "various implementations," "one implementation," "an implementation," etc.) means that a particular feature, structure, or characteristic described in connection with the implementation is included in at least one implementation of the disclosure. The appearances of these phrases in various places in the specification are not necessarily all referring to the same implementation, nor are separate or alternative implementations mutually exclusive of other implementations. Moreover, various features are described which may be exhibited by some implementations and not by others. Similarly, various requirements are described which may be requirements for some implementations but not for other implementations.

As used herein, being above a threshold means that a value for an item under comparison is above a specified other value, that an item under comparison is among a certain specified number of items with the largest value, or that an item under comparison has a value within a specified top percentage value. As used herein, being below a threshold means that a value for an item under comparison is below a specified other value, that an item under comparison is among a certain specified number of items with the smallest value, or that an item under comparison has a value within a specified bottom percentage value. As used herein, being within a threshold means that a value for an item under comparison is between two specified other values, that an item under comparison is among a middle specified number of items, or that an item under comparison has a value within a middle specified percentage range. Relative terms, such as high or unimportant, when not otherwise defined, can be understood as assigning a value and determining how that value compares to an established threshold. For example, the phrase "selecting a fast connection" can be understood to mean selecting a connection that has a value assigned corresponding to its connection speed that is above a threshold.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

From the foregoing, it will be appreciated that specific embodiments of the invention have been described herein for purposes of illustration, but that various modifications may be made without deviating from the scope of the invention. Rather, in the foregoing description, numerous specific details are discussed to provide a thorough and enabling description for embodiments of the present technology. One skilled in the relevant art, however, will recognize that the disclosure can be practiced without one or more of the specific details. In other instances, well-known structures or operations often associated with memory systems and devices are not shown, or are not described in detail, to avoid obscuring other aspects of the technology. In general, it should be understood that various other devices, systems, and methods in addition to those specific embodiments disclosed herein may be within the scope of the present technology.

What is claimed is:

1. A method comprising:
inserting, with a predetermined periodicity, instances of a predetermined sequence of bits into a bit stream such that the inserted instances of the predetermined sequence of bits are separated by a predetermined number of bits from the bit stream;
providing the bit stream to an oscilloscope; and
triggering the oscilloscope based on the inserted instances of the predetermined sequence of bits.

2. The method of claim 1, wherein all of the bits in the predetermined sequence of bits have a same value.

3. The method of claim 1, wherein triggering the oscilloscope based on the inserted instances of the predetermined sequence of bits comprises ignoring occurrences of the predetermined sequence of bits in the bit stream not associated with the predetermined periodicity.

4. The method of claim 1, wherein the bit stream comprises pseudo-random data.

5. The method of claim 4, wherein inserting the instances of the predetermined sequence of bits into the bit stream comprises inserting an instance of the predetermined sequence of bits into the bit stream after every n bits of pseudo-random data, where n is a positive integer.

6. The method of claim 1, wherein the oscilloscope comprises a decision feedback equalizer (DFE) including x taps, wherein the predetermined sequence of bits comprises x bits, and wherein x is a positive integer.

7. The method of claim 6, further comprising generating an eye pattern with the oscilloscope based on triggering the oscilloscope.

8. The method of claim 7, wherein the eye pattern excludes the inserted instances of the predetermined sequence of bits from each sweep of the eye pattern.

9. The method of claim 8, wherein the eye pattern further excludes x bits of the bit stream following the inserted instances of the predetermined sequence of bits from each sweep of the eye pattern.

10. An oscilloscope comprising:
circuitry configured to generate an eye pattern based upon an input signal;
a decision feedback equalizer (DFE) configured to equalize the input signal, the DFE comprising x taps, wherein x is a positive integer; and circuitry configured to trigger a sweep of the oscilloscope based on a predetermined sequence of bits occurring, with a predetermined periodicity, in the input signal, the predetermined sequence of bits comprising at least x bits having a same value.

11. The oscilloscope of claim 10, wherein the circuitry configured to generate an eye pattern is further configured to exclude the predetermined sequence of bits from the sweep of the eye pattern.

12. The oscilloscope of claim 11, wherein the circuitry configured to generate an eye pattern is further configured to exclude an additional x bits following the predetermined sequence of bits from the sweep of the eye pattern.

13. A method comprising:
providing a bit stream comprising pseudo-random data to an oscilloscope across a data path characterized by sufficient signal degradation to prevent the oscilloscope from reliably triggering a sweep of an eye pattern based on receiving the pseudo-random data;
inserting a predetermined sequence of bits into the bit stream at predetermined periodic intervals to open the eye pattern sufficiently during each of the periodic intervals to permit the oscilloscope to trigger the sweep of the eye pattern; and
generating the eye pattern based at least in part on the pseudo-random data and excluding the predetermined sequence of bits from the sweep of the eye pattern.

14. The method of claim 13, wherein all of the bits in the predetermined sequence of bits have a same value.

15. The method of claim 13, further comprising ignoring occurrences of the predetermined sequence of bits in the pseudo-random data.

16. The method of claim 13, wherein inserting the predetermined sequence of bits into the bit stream at predetermined periodic intervals comprises inserting the predetermined sequence of bits in to the bit stream after every n bits of the pseudo-random data, where n is a positive integer.

17. The method of claim 13, wherein the predetermined sequence of bits comprises x bits, and wherein x is a positive integer.

18. The method of claim 13, wherein generating the eye pattern is further based on excluding x bits of pseudo-random data following the predetermined sequence of bits from the sweep of the eye pattern.

19. The method of claim 13, further comprising:
performing equalization on the bit stream before generating the eye pattern.

20. An apparatus comprising:
circuitry configured to generate a bit stream for providing to an oscilloscope that is configured to trigger on a predetermined sequence of bits; and
circuitry configured to insert, with a predetermined periodicity, instances of the predetermined sequence of bits into the bit stream such that the inserted instances of the predetermined sequence of bits are separated by a predetermined number of bits from the bit stream.

21. The apparatus of claim 20, wherein the bit stream is a pseudo-random bit stream (PRBS).

22. The apparatus of claim 20, wherein the apparatus is a bit error rate tester (BERT).

23. The apparatus of claim 20, wherein the apparatus is one of a central processor unit (CPU), a graphics processor unit (GPU), a field-programmable gate array (FPGA), a memory controller, an application-specific integrated circuit (ASIC), a dynamic random access memory (DRAM) device or a non-volatile memory device.

* * * * *